United States Patent [19]
Nishioka

[11] Patent Number: 5,371,476
[45] Date of Patent: Dec. 6, 1994

[54] AMPLIFYING CIRCUIT
[75] Inventor: Kei Nishioka, Kyoto, Japan
[73] Assignee: Rohm Co., Ltd., Kyoto, Japan
[21] Appl. No.: 976,844
[22] Filed: Nov. 16, 1992
[30] Foreign Application Priority Data
Nov. 15, 1991 [JP] Japan .................................. 3-328020
[51] Int. Cl.⁵ .............................................. H03F 3/45
[52] U.S. Cl. ................................... 330/255; 330/257; 330/260
[58] Field of Search ......................... 330/255, 257, 260
[56]           References Cited
       FOREIGN PATENT DOCUMENTS
   153612  8/1985  Japan .................................. 330/257

*Primary Examiner*—James B. Mullins
*Attorney, Agent, or Firm*—Nikaido, Marmelstein, Murray & Oram

[57] ABSTRACT

In an amplifying circuit of current subtraction type, a first output of a differential amplifier is coupled through a first transistor to an output electrode of an output-side transistor of a current mirror circuit and a second output of the differential amplifier is coupled through a second transistor to an input electrode and an output electrode of an input-side transistor of the current mirror circuit so that an output current based on a difference between the first output and the second output flows out from a connection of the first transistor and the output-side transistor of the current mirror circuit. A first circuit device for phase compensation is inserted between bases of input-side and output-side transistors of one of the first and second transistors, and a second circuit device for compensating a direct current offset generated by the first circuit device is inserted between bases of input-side and output-side transistors of the other of the first and second transistors.

4 Claims, 3 Drawing Sheets

AMPLIFYING CIRCUIT

BACKGROUND OF THE INVENTION

1. Field of the Invention

The present invention relates to a differential amplifying circuit, and more particularly, to an amplifying circuit of current subtraction type where a current based on a difference between output currents of 8 pair of transistors constituting a differential amplifier is obtained as an output.

2. Description of the Prior Art

FIG. 1 shows a conventional amplifying circuit. A differential amplifier 1 having a constant current source 2 is constituted by a pair of transistors Q1 and Q2. An output of the differential amplifier 1 is provided from input-side transistors Q3 and Q5 of first and second current mirror circuits 3 and 4 to a third current mirror circuit 5 through output-side transistors Q4 and Q6 of the first and second current mirror circuits 3 and 4.

At this time, an output of the transistor Q6 is coupled to the base and collector of an input-side transistor Q7 of the third current mirror circuit 5, while an output of the transistor Q4 is coupled to the collector of an output-side transistor Q8 of the third current mirror circuit 5. An output of the amplifying circuit of FIG. 1 is directed from a connection (a) of the collector of the transistor Q4 and the collector of the transistor Q8 to an output terminal 6. The output current is the difference between output currents I3 and I4 of the transistors Q4 and Q6 which currents correspond to differential output currents I1 and I2 of the differential amplifier 1.

That is, since the output current I4 of the transistor Q6 also flows to the collector of the transistor Q8 through working of the current mirror circuit 5, both the current I3 which flows from the transistor Q4 and the current I4 which flows to the transistor Q8 are present at the connection (a). A current corresponding to the difference between the currents I3 and I4 flows through the output terminal 6.

Since I1=I2 and I3=I4 when no alternating current inputs are present at input terminals A and B of the differential amplifier 1, the output current passing through the output terminal 6 is 0.

In a case where this circuit is used for, for example, an operational amplifier, an output is partly fed back toward the input side as shown by a dotted line 7. At this time, oscillation may occur on a high-band H of frequency characteristics shown in FIG. 3. To avoid this, a capacitor C1 is connected between the base and collector of the transistor Q4, and a resistor R1 is connected to the base of the transistor Q4. The resistor R1 and the capacitor C1 serve as a phase compensating circuit which makes phase compensation to prevent the occurrence of the oscillation on the high-band H.

In the above-described conventional amplifying circuit, since the resistor R1 is provided, the static output currents I3 and I4 are unbalanced. Consequently, a condition where the output current is not 0 under a static condition (that is, an offset) is generated. Since it is clear that this results in an amplification error, the amplification accuracy of the amplifier deteriorates.

SUMMARY OF THE INVENTION

An object of the present invention is to provide an amplifying circuit where no offset of an output current, due to the presence of a circuit device for phase compensation (compensation for a signal phase).

An amplifying circuit of the present invention is provided with: a differential amplifier; a current mirror circuit; means for coupling a first output of the differential amplifier to an output electrode of an output transistor of the current mirror circuit through a first transistor; means for coupling a second output of the differential amplifier to an input electrode and an output electrode of an input transistor of the current mirror circuit through a second transistor; an output terminal for extracting an output current obtained based on a difference between the first and second outputs from a connection of an output electrode of the first transistor and the output electrode of the output transistor of the current mirror circuit; a first circuit device connected to a base of one of the first and second transistors, for compensating for a signal phase; and a second circuit device connected to a base of the other of the first and second transistors, for compensating for a direct current offset generated at an output terminal by the first circuit device.

According to such features, even though a circuit for phase compensation is provided relative to a transistor, a current which flows from the first transistor to the connection of the first transistor and the output electrode of the output-side transistor of the current mirror circuit and a current which flows out from the connection to the current mirror circuit are statically (galvanically) equal to each other. As a result, the output current is 0. Thus, since no offset is generated, no amplification error is produced.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 3:
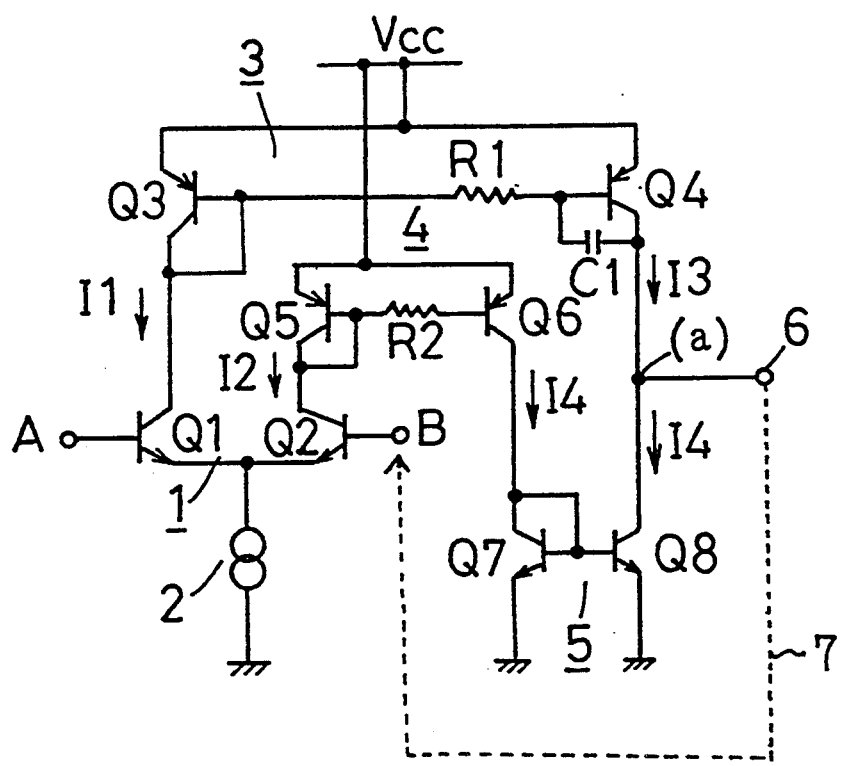
FIG. 3 is a circuit diagram of an amplifying circuit embodying the present invention.

The present invention will hereinafter be described with reference to FIG. 3.

Figure 1:
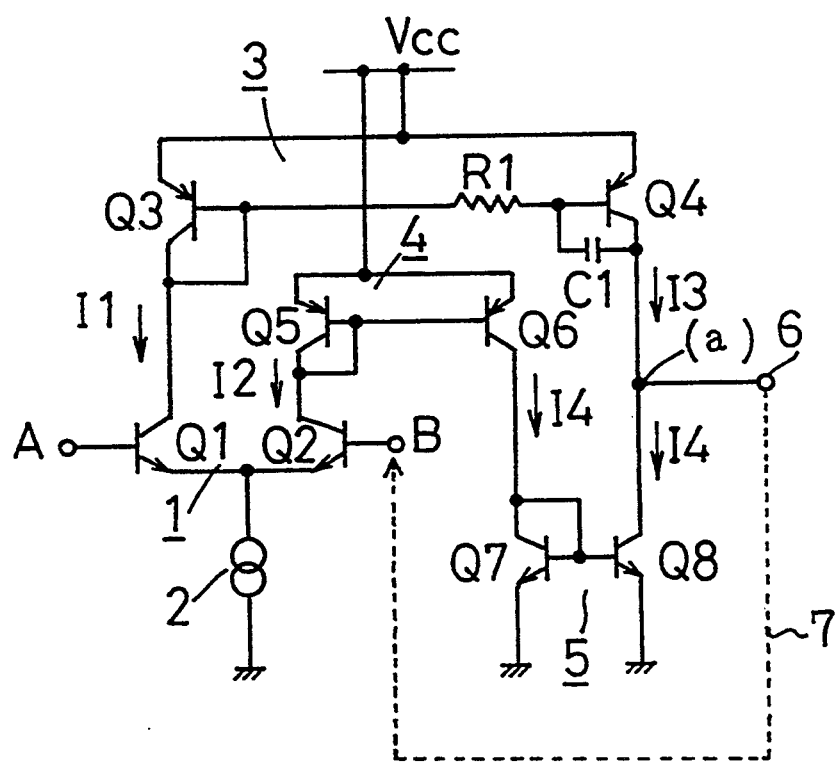
FIG. 1 is a circuit diagram showing an arrangement of a conventional amplifying circuit.
Figure 2:
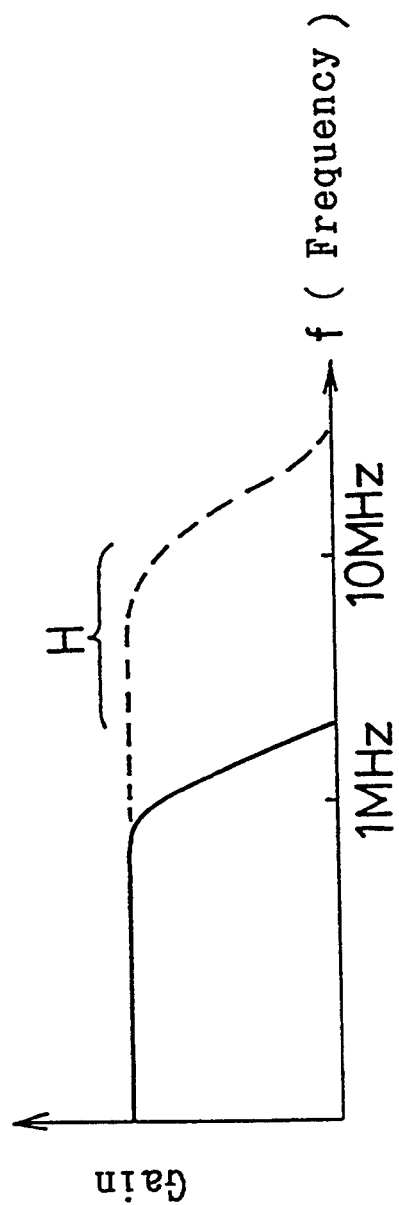
FIG. 2 is a characteristic view for explaining a problem of the conventional amplifying circuit.

In the figure, the same portions as those of FIG. 1 are denoted by the same reference designations. A differential amplifier 1 having a constant current source 2 is constituted by a pair of npn-type transistors Q1 and Q2. The bases of the transistors Q1 and Q2 are connected to input terminals A and B, respectively, and the emitters thereof are connected to the constant current source 2. The collector of the transistor Q1 is connected to the collector and base of an input transistor Q3 of a first current mirror circuit 3. The first current mirror circuit 3 includes the input transistor Q3, an output transistor Q4, a resistor R1 connected between the bases of the transistors Q3 and Q4, and a capacitor C1 connected between the base and collector of the output transistor Q4. The resistor R1 and the capacitor C1 compensate for a phase of an amplified signal.

The collector of the transistor Q2 of the differential amplifier 1 is connected to the collector and base of an input transistor Q5 of a second current mirror circuit 4.

The second current mirror circuit 4 includes the input transistor Q5, an output transistor Q6 and a resistor R2 connected between the bases of the transistors Q5 and Q6. The resistor R2 is provided to compensate for an output current offset generated by the resistor R1, and is selected to have the same value as that of the resistor R1 (that is, R1=R2). The transistors Q3, Q4, Q5 and Q6 are all pnp-type transistors. The emitters thereof are connected to a power source Vcc.

The collector of the output transistor Q6 of the second current mirror circuit 4 is connected to the collector and base of an input transistor Q7 of a third current mirror circuit 5 and to the base of an output transistor Q8 of the third current mirror circuit 5. The transistors Q7 and Q8 are npn-type transistors.

The collectors of the transistors Q4 and Q8 are connected to each other. An output terminal 6 is connected to a connection (a). When this circuit is used as an operational amplifier, an output is partly fed back to an input as shown by a dotted line 7.

In this embodiment, the resistor R2 is inserted between bases of the input transistor Q5 and the output transistor Q6 of the second current mirror circuit 4 connected to the output side of the differential amplifying circuit 1.

The value of the resistor R2 is equal to the value of the phase compensating resistor R1 connected to the first current mirror circuit 3 (that is, R1=R2). With this, since the voltage drops of the resistors R1 and R2 due to base currents of the transistors Q4 and Q6 are equal, the bias conditions of the transistors Q4 and Q6 are the same under a static condition where no alternating current signals are applied to terminals A and B of the differential amplifier 1.

Consequently, a current I3 which flows through the collector of the transistor Q4 and a current I4 which flows through the collector of the transistor Q6 are equal to each other (that is, I3=I4). Since the current I3 which flows to the connection (a) and the current I4 which flows out from the connection (a) are equal to each other as described above, the output current flowing through an output terminal 6 is 0. As a result, no offset is generated. In the above-described embodiment, other circuit devices may be used instead of the resistors R1 and R2. Further, the resistor R1 and the capacitor C1 may be provided in the second current mirror circuit 4, and the resistor R2 may be provided in the first current mirror circuit 3.

Obviously, many modifications and variations of the present invention are possible in light of the above teachings. It is therefore to be understood that within the scope of the appended claims, the invention may be practiced other than as specifically described.

What is claimed is:

1. An amplifying circuit comprising:
    first and second transistors of npn type, said first and second transistors constituting a differential amplifying pair;
    a first current mirror circuit including
        a third transistor of pnp type, with a collector and a base of said third transistor being connected to a collector of the first transistor,
        a fourth transistor of pnp type, with a base of said fourth transistor being connected to the collector of the first transistor through a first resistor, and
        a capacitor connected between a base and a collector of the fourth transistor wherein said capacitor and first resistor compensate for a phase of an amplified signal;
    a second current mirror circuit including
        a fifth transistor of pnp type, with a collector and a base of said fifth transistor being connected to a collector of the second transistor, and
        a sixth transistor of pnp type, with a base of said sixth transistor being connected to the collector of the second transistor through a second resistor having a value which corresponds to a value of the first resistor wherein said second resistor compensates for an output current offset generated by said first resistor;
    a third current mirror circuit including
        a seventh transistor of npn type, with a base and a collector of said seventh transistor being connected to a collector of the sixth transistor, and
        an eighth transistor of npn type, with a base of said eighth transistor being connected to the collector of the sixth transistor and a collector of said eighth transistor being connected to the collector of the fourth transistor; and
    an output terminal connected to the collector of the fourth transistor and to the collector of the eighth transistor.

2. An amplifying circuit according to claim 1, wherein said output terminal is connected to a base of the second transistor to constitute an operational amplifier.

3. An amplifying circuit comprising:
    first and second transistors of a first conductivity type, said first and second transistors constituting a differential amplifying pair;
    a third transistor of a second conductivity type, with a collector and a base of said third transistor being connected to a collector of the first transistor;
    a fourth transistor of the second conductivity type, with a base of said fourth transistor being connected to the collector of the first transistor through a first resistor;
    a capacitor connected between a base and a collector of the fourth transistor wherein said capacitor and first resistor compensate for a phase of an amplified signal;
    a fifth transistor of the second conductivity type, with a collector and a base of said fifth transistor being connected to a collector of the second transistor;
    a sixth transistor of the second conductivity type, with a base of said sixth transistor being connected to the collector of the second transistor through a second resistor of a value which corresponds to a value of the first resistor wherein said second resistor compensates for an output current offset generated by said first resistor;
    a seventh transistor of the first conductivity type, with a base and a collector of said seventh transistor being connected to a collector of the sixth transistor;
    an eighth transistor of the first conductivity type, with a base of said eighth transistor being connected to the collector of the sixth transistor and a collector of said eighth transistor being connected to the collector of the fourth transistor; and
    an output terminal connected to the collector of the fourth transistor and to the collector of the eighth transistor.

4. An amplifying circuit according to claim 3, wherein said output terminal is connected to a base of the second transistor to constitute an operational amplifier.

* * * * *